United States Patent [19]

Hansen et al.

[11] 4,148,091
[45] Apr. 3, 1979

[54] ELECTROMAGNETIC FORCE MACHINE WITH UNIVERSAL PORTABLE POWER SUPPLY

[75] Inventors: Karl A. Hansen; Iver G. Hendrickson, both of Seattle, Wash.

[73] Assignee: The Boeing Company, Seattle, Wash.

[21] Appl. No.: 864,735

[22] Filed: Dec. 27, 1977

[51] Int. Cl.² .............................................. H02M 5/40
[52] U.S. Cl. .......................................... 361/156; 72/56; 307/109; 361/143
[58] Field of Search ........................ 72/56; 29/421 M; 361/743, 144, 148, 155, 156; 307/149, 109, 110, 108, 150

[56] References Cited

U.S. PATENT DOCUMENTS

| | | | |
|---|---|---|---|
| 2,289,000 | 7/1942 | Faudell | 307/149 |
| 2,546,952 | 3/1951 | Spencer | 307/108 X |
| 3,124,724 | 3/1964 | Mihalek | 361/155 |
| 3,149,372 | 9/1964 | Stinger | 72/56 |
| 3,206,652 | 9/1965 | Monroe | 361/144 |
| 3,407,637 | 10/1968 | Dietz et al. | 72/56 |
| 3,411,045 | 11/1968 | Reyner | 361/155 |
| 3,530,304 | 9/1970 | Bachofen | 361/156 X |
| 3,582,179 | 6/1971 | Stuckens | 361/156 |
| 3,659,178 | 4/1972 | Gilbert | 361/148 X |
| 3,694,729 | 9/1972 | Jones | 307/71 X |
| 3,703,958 | 11/1972 | Kolm | 72/56 |
| 3,717,805 | 2/1973 | Gnaedinger | 307/150 X |
| 3,777,176 | 12/1973 | Praeg | 307/108 |
| 3,825,819 | 7/1974 | Hansen et al. | 324/34 R |
| 3,998,081 | 12/1976 | Hansen et al. | 72/56 |

Primary Examiner—Leon Gilden
Attorney, Agent, or Firm—Christensen, O'Connor, Johnson & Kindness

[57] ABSTRACT

An electromagnetic force (EMF) machine with a universal portable power supply is disclosed. The universal portable power supply energizes either a multiple turn flux concentrator or a single turn flux concentrator. The flux concentrators produce magnetic fields that create an outward tension force adapted to perform nondestructive bond tests (tension proof loading) and/or dent removal operations on panels or the like. The power supply includes a slow current pulse subsystem; a fast current pulse subsystem; slow and fast crowbars; and, a firing control. The firing coontrols the production of pulses by the slow and a fast current pulse subsystem, and, the operation of the slow and fast crowbars. The slow pulse subsystem, via the flux concentrator, slowly creates a magnetic field that penetrates the panel; the fast pulse subsystem, via the flux concentrator, rapidly decreases the magnetic field, whereby a negative field gradient is produced across the panel. The negative field gradient exerts the outward tension force on the panel. Further, a set of control switches control the magnitude of the current produced by the slow current pulse subsystem; and, determine the flux concentrator to which the slow and fast pulses are to be applied. Finally, a charging circuit controls the charge level of capacitor banks forming part of the slow and fast current pulse subsystems such that a predetermined ratio exists between the pulses produced by the slow and fast current pulse subsystems.

12 Claims, 4 Drawing Figures

ELECTROMAGNETIC FORCE MACHINE WITH UNIVERSAL PORTABLE POWER SUPPLY

BACKGROUND OF THE INVENTION

This invention is directed to electromagnetic force machines and, more particularly, to electromagnetic force machines suitable for performing non-destructive tests on and/or removing dents from a panel.

In the past, a variety of electromagnetic force (EMF) machines have been developed for use in the production and maintenance of panels to perform non-destructive tests on panel bonds and to remove dents. One such machine is described in U.S. Pat. No. 3,825,819 issued to Karl A. Hansen et al on July 23, 1974 and entitled "Dynamic Proof Loading of Metal Bond Structures Using Pulsed Magnetic Fields". Another such machine is described in U.S. Pat. No. 3,998,081 issued Dec. 21, 1976 to Karl A. Hansen et al, entitled "Electromagnetic Dent Puller". U.S. patent application, Ser. No. 646,068, filed Jan. 2, 1976, by Karl A. Hansen et al and entitled "Electromagnetic Dent Remover with Electromagnetic Localized Work Coil", and U.S. patent application, Ser. No. 752,755 filed Dec. 20, 1976 by Karl A. Hansen et al and entitled "Flux Concentrator for Electromagnetic Pulling" both describe improved flux concentrators for use in EMF machines.

While EMF machines of the type described in the foregoing patents and applications have been found to be well suited for performing non-destructive tests on panel bonds and removing dents from panels, they have certain disadvantages. Specifically, the power supplies utilized with these prior art machines have, in general, been massive and, thus, non-portable. Such power supplies have been non-portable because they have incorporated heavy components. In this regard, heavy oil filled capacitors were included to produce the power used to energize the flux concentrators. In addition to their weight, oil filled capacitors have the disadvantage that they produced power at voltages in the kV range (e.g., 10 kV), which is well above the level needed by flux concentrators. In this regard, flux concentrators require large currents (25,000 amps) not large voltages. As a result, large (3,000 lbs) transformers were required to reduce the oil filled capacitor voltage to a suitable level (to about 300 volts), while increasing the available current to the necessary level. The end result of this arrangement is a heavy (approximately 4 tons), stationary and inefficient power supply. Moreover, when additional voltage was required, additional oil filled capacitor banks were added to the already heavy power supply. (As will be better understood from the following discussion, the voltage required to produce a suitable slow current pulse in a single turn concentrator is higher than the voltage required to produce a suitable slow current pulse in a multiple turn concentrator.) Because prior art EMF machines and their power supplies have been heavy and therefore difficult to transport, in the past, parts have been brought to the location of the machine, rather than the machine being brought to the location of the part, as is desirable in many instances. For example, when it is necessary to remove dents from a panel of a part of a relatively large item, e.g., the flap of an aircraft, it is preferable to be able to bring the dent removal equipment to the location of the part, rather than remove the part and bring it to the location of the equipment, because part removal and reinstallation is usually a time consuming and expensive chore. Moreover, during the removal period of time, often the entire item (aircraft) is out of service. In other instances, it may be almost impossible to remove the part, e.g., a panel forming part of the fuselage of an aircraft is riveted in place and difficult to remove.

Therefore, it is an object of this invention to provide a new and improved electromagnetic force machine.

It is another object of this invention to provide an electromagnetic force machine suitable for performing different types of operations on panels and the like at their location.

It is a further object of this invention to provide an electromagnetic force machine that includes a universal portable power supply adapted to energize a variety of flux concentrators, each of which produces a magnetic field having a unique pattern.

It is yet another object of this invention to provide an electromagnetic force machine including a universal portable power supply suitable for energizing a variety of flux concentrators adapted to perform non-destructive tests and/or dent removal operations on panels and the like.

SUMMARY OF THE INVENTION

In accordance with this invention, an electromagnetic force (EMF) machine with a universal portable power supply is provided. The universal portable power supply is suitable for energizing a variety of single and multiple turn flux concentrators adapted to perform non-destructive tests (tension proof loading) and dent removal operations on panels and the like. The universal portable power supply comprises a slow current pulse subsystem; a fast current pulse subsystem; slow and fast crowbars; and, a firing control. The firing control initiates and controls the production of pulses by the slow and fast current pulse subsystems; and, the operation of the slow and fast crowbars. Further, the universal power supply includes a set of control switches and a charging circuit. The charging circuit controls the charge on capacitor banks forming part of the slow and fast current pulse subsystems and, thus, the ratio of the magnitude of the current pulses produced by the slow and fast current pulse subsystems; and, the control switches control the application of the slow and fast current pulses to the appropriate flux concentrator.

In the preferred form of the invention, the slow current pulse subsystem includes first and second slow capacitor banks. The open/closed position of the control switches determines whether the first and second slow capacitor banks are connected in series or in parallel. When connected in series, the slow capacitor banks are adapted to energize the slow primary winding of a single turn flux concentrator, which also includes a fast primary winding and a single turn secondary work coil. The fast primary winding is adapted to be energized by the fast current pulse subsystem, which comprises a single fast capacitor bank. When the first and second slow capacitor banks are connected in parallel, the control switches are adapted to connect both the slow and fast current pulse subsystems to a multiple turn work coil. Regardless of the control switch state, a rate (di/dt) sensor detects the rate of change of the output of the slow current pulse subsystem; and, the slow and fast crowbars are connected to short, when enabled, their respective slow and fast current pulse subsystems. The position of the set of control switches may be commonly controlled by a manually operated output switch control; or, more preferably, by connectors adapted to connect the flux concentrators to the universal portable power supply. That is, preferably, the open/closed position of the control switches are automatically set to the desired position when a particular flux concentrator is connected to the universal portable power supply. Also, preferably, the slow capacitor banks are low voltage (e.g., 450 volt) high current (e.g. 25,000 amp) electrolytic capacitor banks.

In operation, after the position of the control switches is adjusted, and the flux concentrator is placed over the region of the panel to be tested or operated on, the firing control is actuated. Actuation of the firing control causes the first and second slow capacitor banks to discharge, whereby a slow (0.8–1.6 millisecond rise time) current pulse, having an exponential waveform, is produced. Regardless of whether the flux concentrator is a single or multiple turn flux concentrator, the slow current pulse relatively slowly creates an external magnetic field. The external magnetic field penetrates the panel and creates an internal magnetic field. When the slow current pulse rises to within 5-10% of its maximum value, as determined by the rate sensor, the firing control causes the fast capacitor bank to discharge. The direction of the current produced by the fast capacitor bank is such that the external magnetic field is rapidly decreased, whereby a negative field gradient is produced across the panel. The negative field gradient produces an outward tension force. If the panel is a multilayer panel, the tension force will occur on the outer layer adjacent to the flux concentrator, whereby a force suitable for testing the bond between the layers (the inner of which may be a honeycomb core) is created. Such testing is sometimes described as tension proof loading. Alternatively, the thusly produced outward tension force can be used to remove dents. Subsequent to the firing of the fast capacitor bank, the fast and slow crowbars are enabled and short their respective capacitor banks. The crowbars prevent the power supply output from oscillating and alternatively creating declining magnitude compression and tension forces. It is important that the magnitude of the current pulses have a predetermined ratio (50% for aluminum and magnetic steels, 90% for nonmagnetic steels, 100% for titanium). This ratio is obtained via the charging circuit, which charges the capacitor banks to a level such that the desired ratio is obtained.

It will be appreciated from the foregoing description that the invention provides an electromotive force machine having a universal portable power supply. That is, the power supply can be used with a variety of flux concentrators, each adapted to perform non-destructive tests and/or dent removal operations on panels and the like. Because the power supply is universal, only a single power supply is needed at a location requiring both types of operations to be performed on a panel. Moreover, because the power supply is portable, it can be readily moved to remote locations, such as an aircraft located on an airport runway apron. In this regard, a power supply formed in accordance with the invention, including a housing and other associated components can be formed so as to weigh 1500 pounds or less. Such a power supply is readily manually movable when supported by suitable sized casters. One principal reason the power supply can be made so light is due to the inclusion of low voltage/high current electrolytic capacitors. Because of their low voltage, such capacitors do not require the inclusion of a voltage stepdown transformer. Rather, the output of the capacitors can be applied directly to the flux concentrators.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENTS

Figure 4:
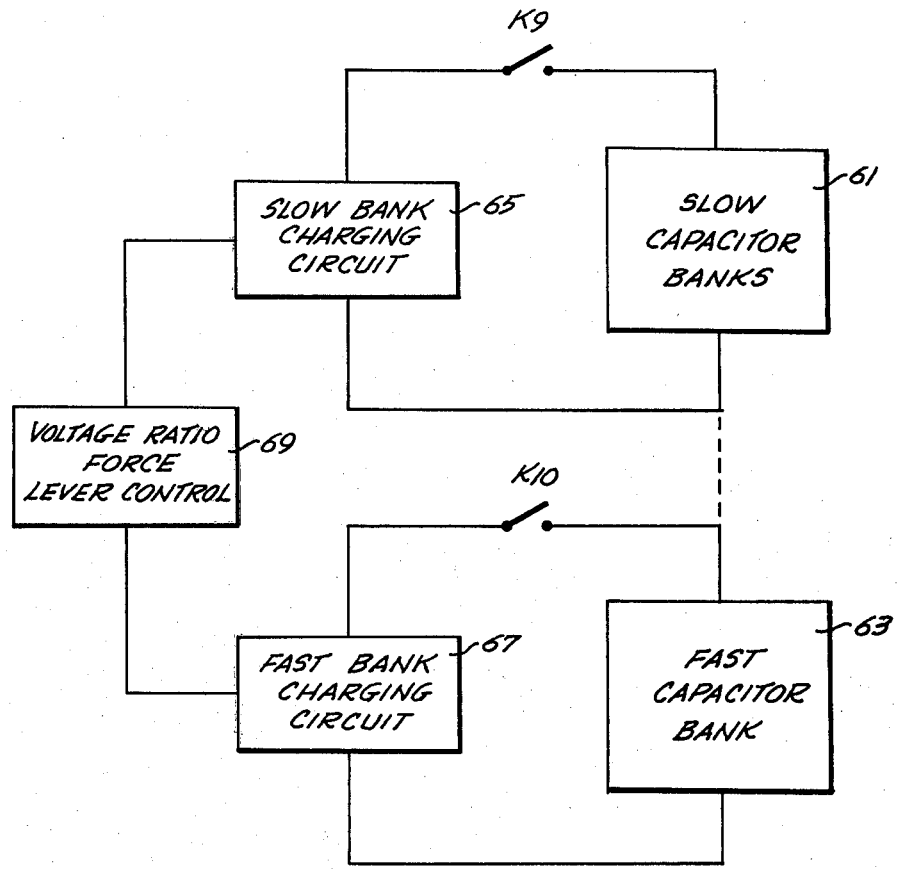

The preferred embodiment of the invention illustrated in FIG. 1 comprises: a multiple turn flux concentrator 11; a single turn flux concentrator 13; and an electromotive force (EMF) power supply and control system 15 (absent the charging circuit illustrated in FIG. 4 and hereinafter described). The multiple turn flux concentrator 11 can take on a variety of forms, all of which include a multiple turn work coil 17 mounted in a suitable support structure. In this regard, attention is directed to U.S. Pat. No. 3,998,081 and U.S. patent application Ser. No. 646,068, referenced above, for a more detailed description of various forms of multiple turn flux concentrators suitable for use in the present invention.

The single turn flux concentrator 13 may also take on various forms, all of which include: a slow primary winding 19; a fast primary winding 21; and a single turn secondary work coil 23. Suitable single turn flux concentrators are described in U.S. patent application Ser. No. 752,755, referenced above.

Figure 1:
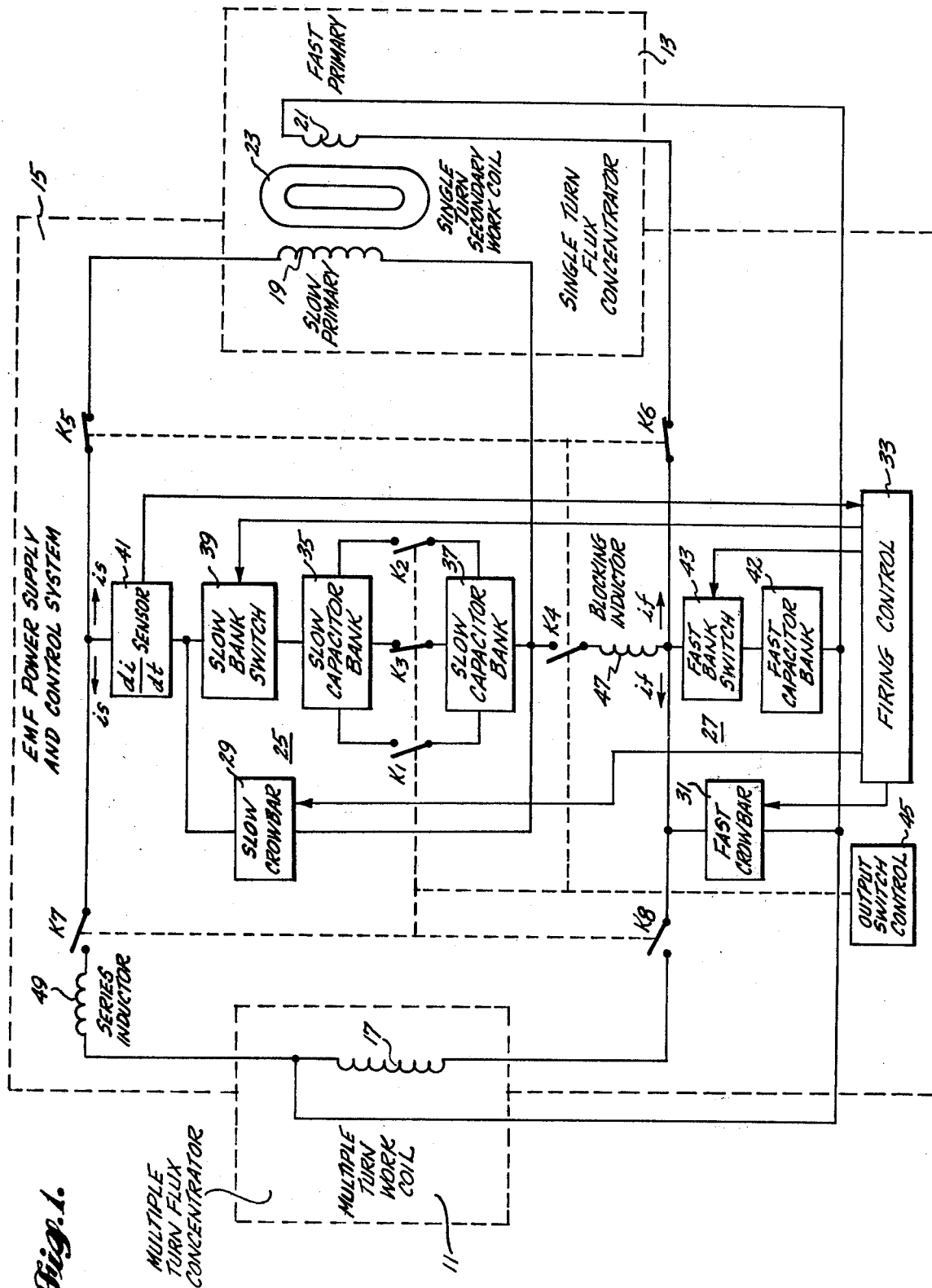
FIG. 1 is a schematic diagram, partially in block form, illustrating a preferred embodiment of an EMF machine including a universal power supply formed in accordance with this invention.

The EMF power supply and control system 15 illustrated in FIG. 1 generally comprises: a slow current pulse subsystem 25; a fast current pulse subsystem 27; a slow crowbar 29; a fast crowbar 31; a firing control 33; and, a set of control switches. The slow current pulse subsystem comprises first and second slow capacitor banks 35 and 37; a slow bank switch 39; and a di/dt (rate) sensor 41. The fast current pulse subsystem 27 generally comprises a fast capacitor bank 42; and, a fast bank switch 43. Preferably, the slow capacitor banks are formed of electrolytic capacitors. For example, the slow capacitor banks may each be formed of 450 volt, 10,000 uf electrolytic capacitors. The fast capacitor bank may be formed of 5–10 kV, 60–240 uf oil filled capacitors.

The set of control switches are schematically illustrated as eight (8) single pole switches designated K1, K2, K3, K4, K5, K6, K7 and K8. In the embodiment of the invention illustrated in FIG. 1, the position (open or closed) of the switches is commonly controlled by an output switch control 45. The switches are formed such that when K3, K5 and K6 are closed, K1, K2, K4, K7 and K8 are open, and when K1, K2, K4, K7 and K8 are closed, K3, K5 and K6 are open.

K1, K2 and K3 are connected between the first and second slow capacitor banks 35 and 37 such that when K3 is closed (and K1 and K2 are open) these capacitor banks are connected in series; and, when K1 and K2 are closed (and K3 is open), these capacitor banks are connected in parallel. The slow bank switch 39 is connected in series with the series or parallel connected first and second slow capacitor banks 35 and 37. The slow crowbar 29 is connected across the series connected slow bank switch 39 and the first and second slow capacitor banks 35 and 37. The input of di/dt sensor 41 is connected to the junction between the slow crowbar 29 and the slow bank switch 39. The output of the di/dt sensor is connected to one terminal each of K5 and K7.

The fast bank switch 43 is connected in series with the fast capacitor bank 42; and, the fast crowbar 32 is connected across the series connected fast bank switch and the fast capacitor bank. The junction between the fast crowbar 31 and the fast bank switch 43 is connected to one terminal each of K6 and K8. The junction between the fast crowbar and the fast bank switch is also connected through a blocking inductor 47 and K4 (series connected) to the junction between the slow crowbar 29 and the slow capacitor banks.

The firing control 33 is actuated by the closure of a switch (not shown). The firing control is connected to and controls the closure of the slow and fast bank switches 39 and 43; and, the enablement of the slow and fast crowbars, in the manner hereinafter described. The firing control is also connected to the di/dt sensor 41 so as to receive a signal related to the rate of change of the slow current pulse produced by the slow current pulse subsystem 25, which pulse is exponential in form.

The other terminal of K5 is connected through the slow primary winding 19 of the single turn flux concentrator 13 to the junction between the slow crowbar 29 and the slow capacitor banks. The other terminal of K6 is connected through the fast primary winding 21 of the single turn flux concentrator 13 to the junction between the fast crowbar 31 and the fast capacitor bank 42. The other terminal of K7 is connected through a series inductor 49 connected in series with the multiple turn work coil 17 of the multiple turn flux concentrator 11 to the other terminal of K8. The junction between the series inductor 49 and the multiple turn work coil 17 is connected to the junction between the fast crowbar 31 and the fast capacitor bank 42.

While the just described connections to the multiple and single turn flux concentrators 11 and 13 have been set forth as direct connections, as well as readily appreciated by those skilled in the electronic arts, these connections may be made via suitable electrical connectors. Further, while the output switch control 45 has been illustrated as a separate mechanism for controlling the position of the K1-K8 switches, the position of these switches could be controlled by the connectors as illustrated in FIG. 3.

Figure 3:
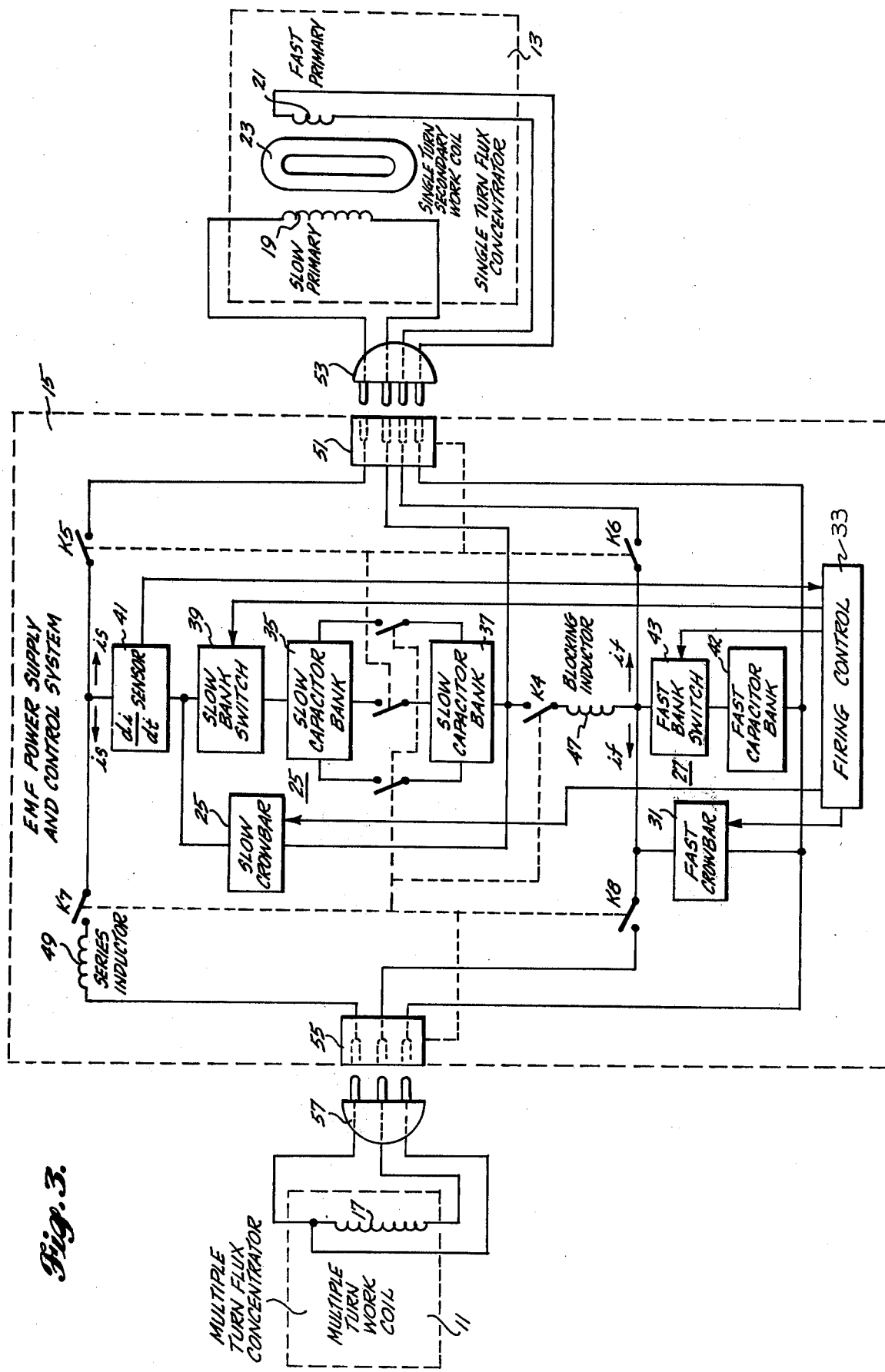
FIG. 3 is a schematic diagram, partially in block form, illustrating an embodiment of the invention similar to the embodiment illustrated in FIG. 1, except that the position of the control switches are controlled by the nature of the flux concentrator connected to the power supply, rather than the position of a manual control; and, FIG. 4 is a block diagram of a charging circuit for charging the capacitor banks of the universal power supplies illustrated in FIGS. 1 and 3.

FIG. 3 illustrates a multiple turn flux concentrator 11 connected to the EMF power supply and control system 15 via an electrical connector comprising male and female elements 55 and 57. When the male and female elements are joined, the electrical connector (via a mechanical coupling arrangement illustrated by the dashed line) causes the closure of K1, K2, K4, K7 and K8; K3, K5 and K6 remaining open. Similarly, a single turn flux concentrator 13 is connected to the EMF power supply and control system 15 via a connector comprising male and female elements 53 and 51. When these male and female elements are joined, the connector causes the closure of K3, K5 and K6; K1, K2, K4, K7 and K8 remaining open. The switch contacts are, thus, normally open and only the necessary closures are made when a flux concentrator is connected to the EMF power supply and control system. If desired, a lockout can be provided that prevents both connectors from being joined at the same time. Other than for this change, FIG. 3 illustrates an embodiment of the invention that is the same as the embodiment illustrated in FIG. 1.

Turning now to a discussion of the operation of the electromotive force machine schematically illustrated in FIG. 1; the output control switch setting determines whether or not power is to be applied to the multiple turn flux concentrator 11 or the single turn flux concentrator 13. Assuming, initially, that power is to be applied to the single turn flux concentrator, the output control switch 45 is turned to a position such that K3, K5 and K6 are closed. In this position, K1, K2, K4, K7 and K8 are open. This is the switch position illustrated in FIG. 1. As a result, the first and second slow capacitor banks are connected in series.

After the output switch control 33 is appropriately positioned, the single turn flux concentrator 13 is placed over the region of the panel to be operated on for tension proof loading or dent removal. Next, the firing control 33 is enabled by the closure of a suitable switch (which may be located in the housing of the single turn flux concentrator 13). All of the remaining functions, hereinafter described, occur automatically. First, the firing control 33 closes the slow bank switch 39 causing the first and second slow capacitor banks to discharge and create a slow current pulse. The slow current pulse has an exponential wave form, as illustrated between time $t_0$ and $t_1$ in the first line of FIG. 2. (FIG. 2, line 1 is actually a generalized waveform of the single turn secondary work coil current created by the combined primary winding currents applied to the single turn flux concentrator). The slow current pulse ($i_s$) is applied through the di/dt sensor 41 and K5 to the slow primary winding 19. The di/dt sensor informs the firing control of the rate of change of the slow pulse. When the rate of change indicates that a predetermined percent (90-95) of the maximum current value has been reached, the firing control 31 causes the fast bank switch 43 to close, whereby the fast capacitor bank is discharged. More specifically, as illustrated in the first line of FIG. 2, between $t_0$ and $t_1$ the slow current pulse ($i_s$) increases in an exponential manner. When the slow current pulse, $i_s$, reaches a certain percentage, such as 90-95% of its maximum value, a fast current pulse, $i_f$, is produced. The fast current pulse, $i_f$, creates a magnetic field that opposes the magnetic field produced by the slow current pulse during the period $t_1$ to $t_2$. As a result, the combined coil currents produce an external field of the type illustrated in line 2 of FIG. 2. Specifically, between $t_1$ and $t_2$, the external field rapidly collapses. This collapse creates a negative field gradient across the panel (or at least across the outer layer of the panel if the panel is a multilayer panel). The negative field gradient exerts an outward tension force on the panel. Because the diffusing rate of the slow current pulse was slow, only a very small compression force was created when the slow current pulse initially occurred. Contrariwise, the rate of fall of the external field is much faster, whereby the outward tension force is much higher. By way of example, the slow current pulse rise time ($t_0-t_1$) normally falls in the 0.8–1.6 millisecond range and the fast current pulse rise time ($t_1-t_2$) normally falls in the 10–40 microsecond range.

At $t_2$, the firing control enables the slow and fast crowbars, whereby the fast and slow capacitor banks are shorted. Failure to short the capacitors would result in oscillations that would create a decreasing cycle of tension/compression/tension forces as current oscillates between the slow and fast primary windings, and their related capacitor banks.

When it is desired to operate the multiple turn flux concentrator 11, the output control switch 43 is moved to its opposite position. As previously discussed, in this position, K1, K2, K4, K7 and K8 are closed; and, K3, K5 and K6 are open. Except for this change in the position of the contacts controlled by the output switch control, the operation of the EMF power supply and control system 15 is the same. That is, the multiple turn work coil is placed over the region of the panel to be operated on. Thereafter, a switch is actuated to enable the firing control 33. The firing control 33 first closes the slow bank switch 39 causing a slow current pulse to occur. Since the first and second slow capacitor banks 35 and 37 are now connected in parallel, rather than in series, the voltage level of the slow current pulse is halved; however, the current pulse still has an exponential form of the type generally illustrated in the first line of FIG. 2. When the rate of change drops to a point indicating that the slow current pulse 33 is within 5 to 10% of its maximum value, as sensed by the di/dt sensor 41, the firing control 33 causes the fast bank switch 43 to close, whereby a fast current pulse of opposite polarity is applied to the multiple turn work coil 17. The combined coil currents are in the general form illustrated in the first line of FIG. 2, between $t_1$ and $t_2$. The combined currents cause a rapid drop in the external field, as illustrated in the second line of FIG. 2 (between $t_1$ and $t_2$). The collapse of the external field causes the previously described negative field gradient across the panel, which creates a tension force and the desired dent removal or loading test to take place. The blocking inductor 47 prevents the rapid or fast pulse produced by the fast pulse subsystem 27 from reaching the slow pulse subsystem 25. The series inductor 51 performs the function of trimming or adjusting the rise time of the slow current pulse. As with the single turn flux concentrator situation, at $t_2$ the fast and slow crowbars are enabled to short the fast and slow capacitor banks.

Since the operation of the embodiment of the invention illustrated in FIG. 3 is identical to the operation of the embodiment of the invention illustrated in FIG. 1, a description of the operation of the FIG. 3 embodiment is not separately set forth herein.

Figure 2:
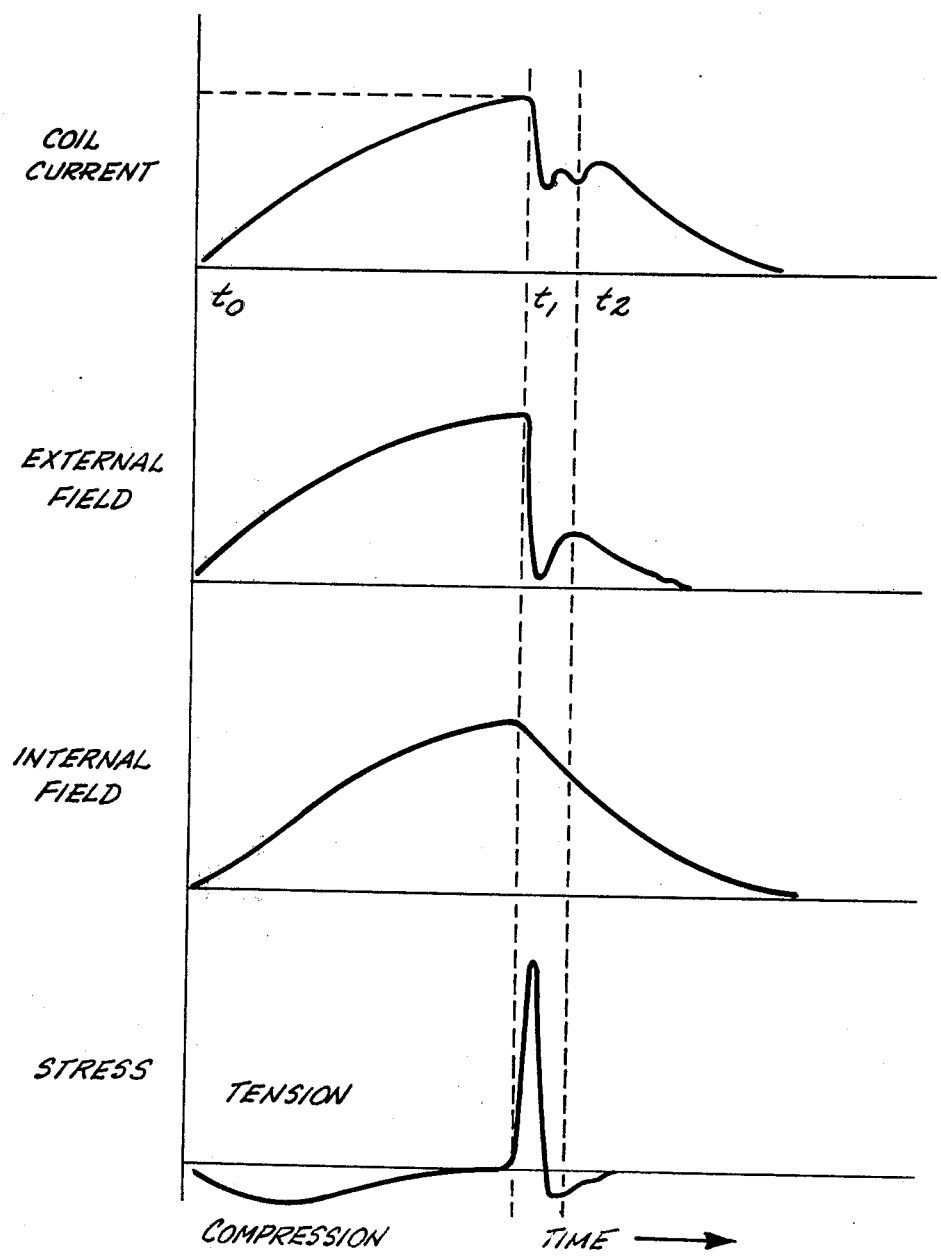
FIG. 2 is a series of waveform diagrams used to assist in describing the operation of an EMF machine.

In order for the correct amount of force to be applied to a particular panel or part, the ratio between the magnitude of the slow current pulse and the magnitude of the fast current pulse must be at a known value. The value relates to the type of material being acted upon. Examples of such values are 50% (1/2) for aluminum and magnetic steels; 90% (9/10) for nonmagnetic steels; and 100% (1/1) for titanium. FIG. 2 illustrates the ratio for aluminum or magnetic steel. That is, the current, when the fast current pulse occurs, drops to about 50% of the value existing just prior to when the fast current pulse started. While the force created by the invention depends upon the absolute magnitude of the current pulses, the ratio remains the same for the same materials.

The desired pulse ratio is obtained by controlling the magnitude of the charge applied to the slow and fast capacitor banks. A block diagram of a suitable charging circuit is illustrated in FIG. 4 and comprises: slow capacitor banks 61; a fast capacitor bank 63; a slow bank charging circuit 65; a fast bank charging circuit 67; and, a voltage ratio force control 69. The voltage ratio force control is connected to the slow and fast bank charging circuits 65 and 67 so as to control the level of the DC voltage produced by the charging circuits. The level is controlled such that the desired ratio is achieved. The slow bank charging circuit 65 is connected to the slow capacitor banks 61 via a switch designated K9; and, the fast bank charging circuit 67 is connected to the fast capacitor bank 67 via a switch designated K10. When it is desired to charge the capacitor banks, K9 and K10 are closed (preferably simultaneously). As a result, the capacitor banks charge up to a voltage level determined by the voltage level of the outputs of the bank charging circuits. Since the ratio of the outputs of the bank charging circuits is adjusted to the desired value, the capacitor banks are charged to the desired ratio.

As will be readily appreciated from the foregoing description, the invention provides an electromotive force (EMF) machine that has a universal portable power supply. The power supply is portable because it can be easily produced in a form that can be readily moved by manual power. In this regard, if the slow capacitor banks are formed of low voltage capacitors of the type described above, whereby no voltage step-down transformer is needed, an entire power supply including its housing and the charging circuit, can be produced so as to have a weight of approximately 1,500 pounds. Such a structure can be easily manually moved if supported by casters.

While a preferred embodiment of an EMF machine with a universal portable power supply has been illustrated and described, it will be appreciated that various changes can be made therein without departing from the spirit and scope of the invention. Hence, the invention can be practiced otherwise than as specifically described herein.

The embodiments of the invention in which an exclusive property or privilege is claimed are defined as follows:

1. An electromagnetic force machine comprising:
   (a) a single turn flux concentrator including a slow primary winding, a fast primary winding and a single turn secondary work coil;
   (b) a multiple turn flux concentrator including a multiple turn work coil; and,
   (c) a universal power supply for energizing said single and multiple turn flux concentrators, said universal power supply comprising:
      (1) a slow current pulse susbsystem for producing a relatively slow rising current pulse, said slow current pulse subsystem including at least first and second slow capacitor banks and a slow bank switch connected to said first and second slow capacitor banks for controlling the initiation of said slowly rising current pulse by said slow capacitor banks;

(2) a fast current pulse subsystem for producing a relatively fast rising current pulse, said fast current pulse subsystem including a fast capacitor bank and a fast bank switch connected to said fast capacitor bank so as to control the initiation of said relatively fast rising current pulse produced by said fast capacitor bank;

(3) shorting means connected to said slow and fast current pulse subsystems for shorting said first and second slow capacitor banks and said fast capacitor bank when enabled by a suitable signal;

(4) switch means connected between said first and second slow capacitor banks for connecting said first and second slow capacitor banks in series or parallel and between said single and multiple turn flux concentrators for selectively applying said relatively slow rising and said relatively fast rising current pulses to said single and multiple turn flux concentrators; and, (5) a control system for controlling the closure of said slow and fast bank switches such that said slow current pulse subsystem first applies said relatively slow rising pulse to the selected one of said single and multiple turn flux concentrators for a period of time adequate for said slowly rising current pulse to achieve a level equal to about 90% or more of its maximum value and, then, said fast current pulse subsystem applies said relatively fast rising current pulse to said selected one of said single and multiple turn flux concentrators such that the magnetic field produced by said relatively slow rising current pulse rapidly collapses.

2. An electromagnetic force machine as claimed in claim 1 wherein said switch means includes a first switch for connecting said first and second slow capacitor banks in series, a second switch for connecting said slow current pulse subsystem to said slow primary winding of said single turn flux concentrator and a third switch for connecting said fast current pulse subsystem to said fast primary winding of said single turn flux concentrator, said first, second and third switches being simultaneously opened and closed.

3. An electromagnetic force machine as claimed in claim 2 wherein said switch means also includes fourth and fifth switches for connecting said first and second slow capacitor banks in parallel, a sixth switch for connecting said slow current pulse subsystem to said multiple turn work coil of said multiple turn flux concentrator and a seventh switch for connecting said fast current pulse subsystem to said multiple turn work coil of said multiple turn flux concentrator, said fourth, fifth, sixth and seventh switches being simultaneously opened and closed.

4. An electromagnetic force machine as claimed in claim 3 including an output control switch connected to said first, second, third, fourth, fifth, sixth and seventh switches for controlling said switches such that said first, second and third switches are closed when said fourth, fifth, sixth and seventh switches are open and said first, second and third switches are open when said fourth, fifth, sixth and seventh switches are closed.

5. An electromagnetic force machine as claimed in claim 5 wherein said switch means also includes an eighth switch and a blocking inductor, said blocking inductor and said eighth switch being connected between said slow and fast current pulse subsystems, said eighth controlled by said output switch control so as to be closed when said fourth, fifth, sixth and seventh switches are closed and open when said fourth, fifth, sixth and seventh switches are open.

6. An electromagnetic force machine as claimed in claim 5 wherein said control means includes a rate sensor and a firing control, said rate sensor connected to sense the rate of rise of said relatively slow rising current pulse and apply a signal in accordance therewith to said firing control, said firing control connected to said slow and fast bank switches so as to close said fast bank switch when said rate signal indicates that said relatively slow rising current pulse is within about 90% or more of its maximum value.

7. An electromagnetic force machine as claimed in claim 3 including a first connector for connecting said single turn flux concentrator to said universal power supply, said first connector connected to said first, second and third switches so as to close said first, second and third switches when said single turn flux concentrator is connected to said universal power supply.

8. An electromagnetic force machine as claimed in claim 4 including a first connector for connecting said single turn flux concentrator to said universal power supply, said first connector connected to said first, second and third switches so as to close said first, second and third switches when said single turn flux concentrator is connected to said universal power supply.

9. An electromagnetic force machine as claimed in claim 8 including a second connector for connecting said multiple turn flux concentrator to said universal power supply, said second connector to said fourth, fifth, sixth and seventh switches so as to close said fourth, fifth, sixth and seventh switches when said multiple turn flux concentrator is connected to said universal power supply.

10. An electromagnetic force machine as claimed in claim 9 wherein said switch means also includes an eighth switch and a blocking inductor, said blocking inductor and said eighth switch being connected between said slow and fast current pulse subsystems, said eighth switch controlled by said output switch control so as to be closed when said fourth, fifth, sixth and seventh switches are closed and open when said fourth, fifth, sixth and seventh switches are open.

11. An electromagnetic force machine as claimed in claim 10 wherein said control means includes a rate sensor and a firing control, said rate sensor connected to sense the rate of rise of said relatively slow rising current pulse and apply a signal in accordance therewith to said firing control, said firing control connected to said slow and fast bank switches so as to close said fast bank switch when said rate signal indicates that said relatively slow rising current pulse is within about 90% or more of its maximum.

12. An electromagnetic force machine as claimed in claim 1 including a charging circuit for charging said slow capacitor banks and said fast capacitor bank such that a predetermined ratio exists between said fast and slow rising current pulses.

* * * * *

UNITED STATES PATENT AND TRADEMARK OFFICE
CERTIFICATE OF CORRECTION

PATENT NO. : 4,148,091

DATED : April 3, 1979

INVENTOR(S) : Karl A. Hansen et al.

It is certified that error appears in the above-identified patent and that said Letters Patent are hereby corrected as shown below:

Abstract, line 11: "coontrols" is changed to --control controls--.

Abstract, line 12: "subsystem" is changed to --subsystems--.

Column 10, line 4: "eighth controlled" is changed to --eighth switch controlled--.

Signed and Sealed this

Twenty-third Day of October 1979

[SEAL]

Attest:

RUTH C. MASON
Attesting Officer

LUTRELLE F. PARKER
Acting Commissioner of Patents and Trademarks